SAWTOOTH OSCILLATOR

Filed Aug. 4, 1959

INVENTOR
F. P. CIRONE

BY Charles Scott Phelan
ATTORNEY

United States Patent Office 3,015,784

Patented Jan. 2, 1962

3,015,784

SAWTOOTH OSCILLATOR

Frank P. Cirone, Dover, N.J., assignor to Bell Telephone Laboratories, Incorporated, New York, N.Y., a corporation of New York Filed Aug. 4, 1959, Ser. No. 831,613
15 Claims. (Cl. 331—111)

Figure 1:
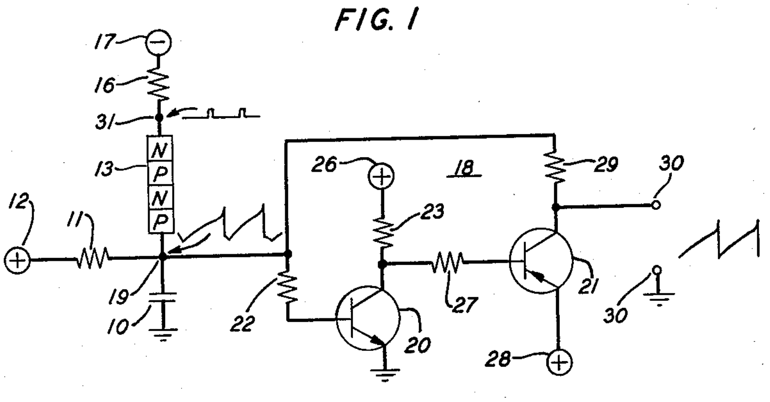

This invention relates to sawtooth oscillation generators. More particularly, the invention relates to improved means for controlling the duration of output pulses from a sawtooth oscillation generator.

Sawtooth oscillation generators are frequently employed as time base signal generators. They generally comprise a capacitor, a high impedance charging circuit for the capacitor, a low impedance discharge circuit for the capacitor, and a normally-open switching device in the discharge circuit. The capacitor is charged through its high impedance charging circuit until it attains a voltage charge of sufficient magnitude to activate the switching device and render the discharge circuit conducting. The capacitor then discharges through its low impedance discharge circuit until the switching device can no longer sustain conduction. At that time the switching device opens, and the capacitor begins to charge again. Typical switching devices that have been used in a sawtooth oscillation generator are vacuum tube discharge devices, gas tubes, and PNPN semiconductor diodes.

In the case of the PNPN diode, and at least some of the other above-mentioned switching devices, the exact breakdown voltage at which the device can be activated is not always certain because the nominal breakdown voltage may be subject to variation due to variations in the ambient temperature at the location of the device and because actual and nominal breakdown voltages may differ as a result of manufacturing tolerances. If the breakdown point of the device is not certain under all conditions, or may change upon the substitution of one device for another, the point at which the sawtooth oscillation cycle of the oscillator is terminated is similarly uncertain. Likewise, the oscillation period and frequency are uncertain, and the usefulness of such an oscillator as a time base device is limited.

It is, therefore, a principal object of the invention to increase the frequency stability of sawtooth oscillation generators.

Another object is to make the frequency of a sawtooth oscillation generator independent of the characteristics of active circuit devices therein.

It is another object to make the frequency of a sawtooth oscillation generator primarily dependent upon passive circuit elements which are relatively independent of temperature effects and of variations due to manufacturing tolerances.

These and other objects of the invention are realized in an illustrative embodiment thereof in which the pulse width control of a free-running sawtooth generator, including a capacitor and charging and discharging circuits therefor, is improved by including in the generator an amplifier which is responsive to the capacitor voltage for triggering into conduction a switching device in the capacitor discharge circuit to terminate each sawtooth pulse. A PNPN diode is employed as the switching device for the purpose of illustration, but any device could be employed which has a switch-closing potential that is relatively high compared to its switch-opening potential.

Figure 2:
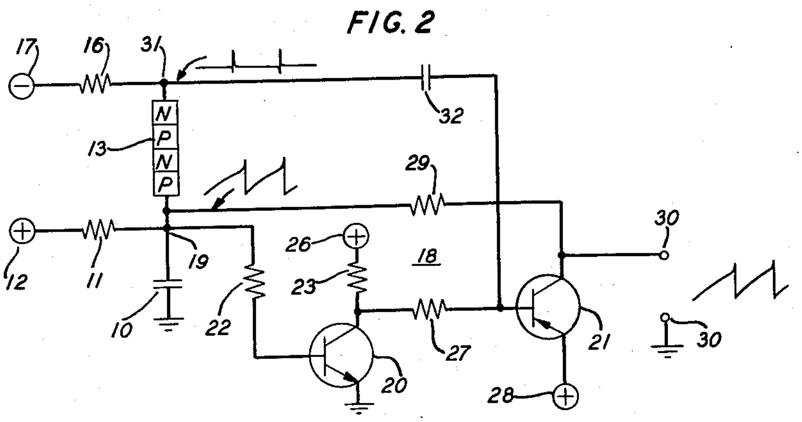
Figure 3:
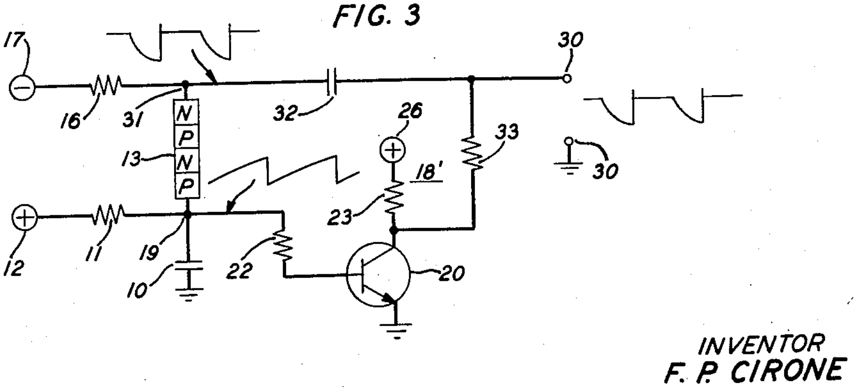

A more complete understanding of the operation, objects, features, and advantages of the invention may be obtained from a consideration of the following specification including the appended claims, in connection with the attached drawings in which FIGS. 1 through 3 are schematic diagrams of three embodiments of the invention in sawtooth time base oscillation generators.

Referring to the sawtooth oscillation generator illustrated in FIG. 1, a capacitor 10 is connected in series in a high impedance charging circuit which includes a resistor 11, a positive terminal 12 of a source of operating potential (not shown), and ground. Capacitor 10 is also connected in series in a low impedance discharge circuit which includes a PNPN diode 13, a resistor 16, a negative terminal 17 of a source of potential (not shown), and ground. The characteristics and operation of a PNPN diode are described in detail in the W. Shockley Patent No. 2,855,524 which issued October 7, 1958. Briefly, however, such diodes present a very high impedance to current flow until the applied forward bias voltage has attained a relatively large magnitude, the breakdown voltage. When the breakdown voltage has been attained the diode switches to a low impedance condition wherein it conducts freely with a relatively small sustaining bias voltage applied thereto. Conduction continues in the low impedance condition unless the current is reduced to such a low value that conduction in the diode can no longer be sustained, and then the diode switches back to its high impedance condition.

The sawtooth oscillation generator described thus far operates in the usual manner in that capacitor 10 charges via resistor 11 until a sufficient voltage is built up in a positive direction with respect to ground to cooperate with the negative potential at terminal 17 and cause diode 13 to conduct. Capacitor 10 discharges rapidly through diode 13 in the low impedance discharge circuit until the current through diode 13 has been reduced to such a point that diode 13 can no longer sustain conduction. At this time capacitor 10 is charged negatively with respect to ground; diode 13 is restored once more to its high impedance, essentially non-conducting, condition; and capacitor 10 begins to charge again via resistor 11. It will be noted that during the operation of the particular oscillator illustrated in FIG. 1 the voltages across capacitor 10 change back and forth between values that are positive and negative, respectively, with respect to ground. In some embodiments the entire range of capacitor voltage change may be of a single polarity. Accordingly, for convenience in description, the positive-going change is hereinafter simply designated the charging part of the operation and the negative-going change is designated the discharging part of the operation.

In accordance with the FIG. 1 embodiment of the invention, a regenerative transistor amplifier 18 has the input thereof connected to a terminal 19 in the charging and discharging circuits between capacitor 10 and diode 13. Amplifier 18 comprises an NPN transistor 20 and a PNP transistor 21 connected in tandem, common emitter, amplification stages. A resistor 22, which is generally of a much smaller resistance than is resistance 11, connects terminal 19 to the base electrode of transistor 20; and the emitter electrode of transistor 20 is connected to ground. The collector electrode of transistor 20 is connected via a load resistor 23 to a positive terminal 26 of a source of operating potential (not shown), and it is also connected to the base electrode of transistor 21 via a resistor 27. The emitter electrode of transistor 21 is connected to a positive terminal 28 of a further source of operating potential (not shown), and a feedback connection is provided from the collector electrode of transistor 21 via a resistor 29 to the input of amplifier 18 and to terminal 19. The output of amplifier 18, and of the entire sawtooth oscillator, may be derived between the collector electrode of transistor 21 and ground at the output terminals 30, 30. Operating potentials and circuit resistances in amplifier 18 are selected in a well known manner so that transistors 20 and 21 are normally nonconducting in the absence of a predetermined minimum voltage magnitude between the terminals of capacitor 10.

Considering now the operation of the sawtooth generator circuit of FIG. 1, assume that capacitor 10 is charging. Upon the attainment of the aforementioned predetermined voltage across capacitor 10, which will generally be less than the normal breakdown voltage level for diode 13, transistors 20 and 21 are biased into conduction. Preferably, transistor 21 is biased into saturated conduction. For the circuit of FIG. 1, the predetermined voltage across capacitor 10 would be ground potential for at that voltage level the base-emitter junction of transistor 20 becomes forward biased and begins to conduct. Upon conduction in transistor 20, the voltage at the collector electrode thereof is drawn to substantially ground potential thereby biasing transistor 21 into conduction. The conduction in transistor 21 drives the collector electrode thereof to the positive potential of terminal 28 and this positive potential is coupled via resistor 29 back to the base-emitter circuit of transistor 20 in a regenerative fashion.

The regenerative feedback action rapidly increases the potential of terminal 19 in a positive direction. When the potential at terminal 19 has attained a value such that, together with the negative potential at terminal 17, the breakdown voltage of diode 13 has been exceeded, diode 13 is driven into its low impedance condition and begins to conduct. The entire regenerative action from the initial triggering of transistor 20 to the breakdown of diode 13 occurs almost instantaneously as indicated by the waveforms adjacent to terminal 19, output terminals 30, 30, and a terminal 31 that is common to diode 13 and resistor 16. For greatest frequency stability, the time required for amplifier 18 to raise the potential at terminal 19 to a level which is sufficient to break down diode 13 should be substantially smaller than the time required for one full cycle of oscillation. Such a relationship, which is satisfied by amplifier 18, assures that any gain variations in the transistors which might change the time required for amplifier 18 to perform its described function will cause only a negligible change in the over-all cycle time.

After diode 13 begins to conduct, capacitor 10 discharges rapidly toward a negative potential with respect to ground which corresponds approximately to the negative potential at terminal 17. When the discharge current has reached a sufficiently low level that diode 13 can no longer sustain conduction, the diode returns to its Off, nonconducting, condition and one cycle of oscillation is complete.

The discharge time for capacitor 10, which corresponds to the conduction time of diode 13, is quite brief compared to the over-all cycle length as indicated by the small pulses in the waveform adjacent to the terminal 31. During that brief discharge interval the potential at terminal 19 is driven negatively and reversely biases the base-emitter junction of transistor 20. This action biases transistor 20 Off, nonconducting, and likewise biases transistor 21 Off.

It can be seen from the above description of the operation of the circuit of FIG. 1 that the termination instant of each cycle of the sawtooth oscillation is essentially under the control of the voltage across capacitor 10 and resistor 11. Oscillator frequency is independent of the actual breakdown voltage of the diode 13 for any particular diode and for any particular ambient temperature thereof because, in effect, amplifier 18 tells diode 13 when to turn On by increasing the diode voltage almost instantaneously until breakdown occurs.

Oscillators of the type illustrated in FIG. 1 have been operated with repetition intervals which are greater than the transistor switching time. Oscillation frequencies ranging up to about 100 kilocycles per second have been obtained.

It has been found that while a typical diode 13 may have a nominal breakdown voltage of 50 volts, the actual breakdown voltage may be 50 volts, plus or minus 5 volts, depending upon the manufacturing tolerances and ambient temperature, i.e. a range of variation which is 20 percent of the nominal voltage. However, it is well known that the base-emitter junction of a transistor, such as transistor 20, generally presents a voltage difference of less than one volt when forward biased, including variations due to manufacturing tolerance and ambient temperature. Thus, the total potential drop across this transistor junction is generally less than 2 percent of the previously mentioned 50-volt breakdown level and the variations are much less than 2 percent. In other words, by employing amplifier 18, oscillator frequency stability is improved because the threshold voltage at which each cycle is to be terminated can be selected with an accuracy which is about an order of magnitude better than the accuracy without such an amplifier connection.

Referring to FIG. 2, the sawtooth oscillation generator illustrated there is similar to the generator of FIG. 1, and corresponding circuit elements have been indicated by the same reference characters. The significant difference between the embodiments of FIGS. 1 and 2 is the additional connection which is provided to couple the amplifier 18 output at the base electrode of transistor 21 to the terminal 31 of diode 13. This connection includes a capacitor 32 therein and serves two functions. It couples negative-going voltage transients which appear at the base electrode of transistor 21 to the terminal 31 of diode 13 to help bias diode 13 into conduction, and after diode 13 begins to conduct capacitor 32 couples the positive-going voltage transient at terminal 31 to the base electrode of transistor 21 to bias transistor 21 Off. The first-mentioned effect is small but important because it tends to drive terminal 31 negatively while terminal 19 is being driven positively thereby reducing the time required to bias diode 13 into conduction. The operation of this arrangement is otherwise similar to the operation of the circuit of FIG. 1, but it is characterized by substantially lower switching times than is the circuit of FIG. 1.

Referring to FIG. 3, the additional embodiment of the invention illustrated there is characterized in that amplifier 18 has been reduced to a single stage amplifier 18′ which no longer has regenerative feedback. A connection is now provided from the collector electrode of transistor 20 to terminal 31 via a resistor 33 and the capacitor 32. This connection stabilizes oscillator frequency by dictating to diode 13 in a slightly different manner exactly when it must turn On. The negative-going voltage transient at the collector electrode of transistor 20 when the transistor is triggered is capacitively coupled to terminal 31 and biases diode 13 into conduction to initiate the discharge of capacitor 10. The operation of the circuit of FIG. 3 is otherwise similar to the operation of the circuit of FIG. 1.

It may be noted that the circuit of FIG. 3 may not be self-starting if the breakdown voltage of diode 13 is substantially larger than the voltage at terminal 17 unless the positive potentials are applied to terminals 12 and 26 after the negative potential is applied to terminal 17. This is due to the fact that if the positive operating potential is applied to terminal 12 before the negative operating potential is applied to terminal 17, capacitor 10 becomes positively charged and biases transistor 20 into conduction thereby coupling a negative-going transient voltage to terminal 31. If this transient is of insufficient magnitude to bias diode 13 into conduction without the assistance of the negative potential at terminal 17, diode 13 remains Off and amplifier 18′ remains On. By the time that the negative operating potential has been applied at terminal 17, the transient may have ended. With no transient coupled back to diode 13 from amplifier 18′, the total potential drop across diode 13 may never exceed the potential from terminal 17 to ground by a sufficient amount to bias diode 13 into conduction. Resistor 11 is generally much larger than resistor 22; and these two resistors, together with the base-emitter circuit of transistor 20, form a potential divider between ground and the positive terminal 12. Accordingly, the maximum voltage that can be attained at terminal 19 is limited to a relatively small value by this potential divider, and such small value will usually be insufficient to bias diode 13 On.

If, however, the negative source of operating potential had been first applied, the terminal 31 would have been at a negative potential with respect to ground at the time of the negative-going voltage transient which occurs in response to the triggering of transistor 20. Under these circumstances, the total negative potential from terminal 17 and from the transient would be sufficient, together with the positive voltage at terminal 19, to bias diode 13 into conduction and cause the circuit to operate in the usual manner hereinbefore described.

The output waveforms of FIG. 3 are somewhat different than those in FIGS. 1 and 2. The wave at terminals 30, 30 is inverted with respect to output waves in the previously described embodiments since there is one less stage of inverting amplification in amplifier 18′ than there was in the amplifier 18. The voltage wave at terminal 31 is similar to the wave at output terminals 30, 30 since terminal 31 is coupled to the output terminals via capacitor 32. However, it is clear from the waveforms in FIG. 3 that the switching time for discharging capacitor 10 has not been increased.

In summary with respect to the above-described embodiments, the frequency stability of a simple sawtooth wave oscillator is improved by employing a triggering circuit with particular response characteristics to actuate the switching device in the oscillator with a high degree of precision in response to the voltage across the oscillator capacitor. The triggering device is characterized by a triggering voltage range which is small in relation to the voltage required to actuate the switch, and by an operating time interval between triggering of the device and actuation of the switch which is small in relation to the total sawtooth wave cycle time.

Although this invention has been described in connection with particular embodiments thereof, it is to be understood that additional embodiments and applications of the invention will be apparent to those skilled in the art and are included within the spirit and scope of the invention.

What is claimed is:

1. In a sawtooth oscillator comprising a capacitor, a high resistance charging circuit for said capacitor, and a low resistance normally nonconducting discharge circuit for said capacitor, the improvement which comprises a PNPN diode connected in said discharge circuit for normally holding the last-mentioned circuit nonconducting, a normally nonconducting amplifier, means connecting the input of said amplifier across said capacitor for triggering said amplifier into conduction in response to a capacitor voltage in excess of a predetermined magnitude, and means connecting the output of said amplifier to at least one terminal of said diode for biasing said diode into conduction in response to conduction in said amplifier.

2. An oscillation circuit comprising a capacitor, a charging path connected to said capacitor, a normally nonconducting discharge path connected to said capacitor, a nonlinear conduction device connected in said discharge path and normally biased nonconducting in response to the voltage on said capacitor, a regenerative feedback amplifier having the input thereof connected to said capacitor, means normally biasing said amplifier in a nonconducting condition in the absence of a predetermined minimum voltage on said capacitor, and means connecting the output of said amplifier to at least one terminal of said device for biasing said device into conduction in response to conduction in said amplifier.

3. A sawtooth oscillation generator comprising an amplifier, means normally biasing said amplifier in a nonconducting condition in the absence of an input voltage in excess of a predetermined voltage level, a capacitor connected to the input of said amplifier, means charging said capacitor, means discharging said capacitor, the last-mentioned means comprising a voltage-sensitive switching device connected in series with said capacitor in said discharging means, and means connecting an output of said amplifier to at least one terminal of said device for biasing said device into conduction in response to the attainment of said predetermined voltage level across said capacitor.

4. The oscillator circuit in accordance with claim 3 in which said amplifier comprises two transistors connected in tandem amplification stages and said connecting means comprises a resistor and a capacitor connected in series between said amplifier output and the input of said amplifier.

5. The oscillator circuit in accordance with claim 3 in which said amplifier comprises two transistors connected in tandem in common emitter amplifier stages, and said connecting means comprises a resistive feedback circuit interconnecting the output and the input of said amplifier.

6. The oscillation generator in accordance with claim 5 in which said transistors are of opposite conductivity types, each having a base electrode, an emitter electrode, and a collector electrode, connecting means couple said first transistor base electrode to one terminal of said capacitor, a metallic circuit connects said first transistor collector electrode to said second transistor base electrode, and amplifier output connecting means regeneratively couples said second transistor collector electrode to said first transistor base electrode.

7. The oscillator circuit in accordance with claim 3 in which said amplifier comprises two transistors connected in tandem amplification stages and said connecting means comprises a first circuit connected between said amplifier output and one terminal of said device, and a second circuit connected between the interstage coupling network of said amplifier and a second terminal of said device.

8. The oscillator circuit in accordance with claim 7 in which one of said first and second circuits includes a capacitor connected in series therein and the other of said first and second circuits includes a resistor connected in series therein.

9. The amplifier circuit in accordance with claim 3 in which said amplifier comprises a single transistor amplifier stage having means connecting the input thereof to one terminal of said device, and said connecting means couples the output of said amplifier to another terminal of said device.

10. The oscillator circuit in accordance with claim 9 in which said connecting means comprises a resistor and a capacitor connected in series therein between said amplifier output and said another terminal of said device.

11. The oscillator circuit in accordance with claim 3 in which said connecting means comprises means coupling outputs of different phases from said amplifier to different terminals, respectively, of said device.

12. The oscillator circuit in accordance with claim 3 in which said amplifier comprises two transistors connected in tandem amplification stages, said connecting means comprises a circuit connected between said amplifier output and a first terminal of said device, and means couple voltage variations at a second terminal of said device to one of said stages for biasing said one stage into a nonconducting condition in response to conduction in said device.

13. In an oscillator for generating sawtooth oscillations and comprising a capacitor and a normally-open, voltage-sensitive, switching device in a circuit for changing the charge on said capacitor in response to the operation of said device to the switch-closed condition, said device operating to said switch-closed condition in response to the application thereto of a predetermined voltage, the improvement which comprises a trigger circuit, means connecting said capacitor to the input of said trigger circuit for actuating said trigger circuit in response to a predetermined potential of said capacitor, means connecting the output of said trigger circuit to said device for operating said device to the switch-closed condition in response to the actuation of said trigger circuit, said trigger circuit being actuatable by a voltage included in a predetermined range of voltages, the magnitude of said range being much smaller than the magnitude of said predetermined voltage, and the operating time required for said trigger circuit to actuate said device being relatively small compared to the period of said sawtooth oscillations.

14. An oscillator for generating impulses with a high degree of frequency stability, said oscillator comprising a capacitor, a charging circuit connected to said capacitor, a discharging circuit connected to said capacitor, a switching device connected in said discharging circuit, a regenerative amplifier, a single circuit connection between said amplifier and said circuits of said capacitor, said single circuit connection comprising means connecting the input of said amplifier to said discharging circuit, and said amplifier including means responsive to the attainment of a predetermined potential difference across said capacitor for rapidly increasing the potential difference across said capacitor.

15. A frequency stabilized time base generator comprising a capacitor, a first resistor, means including said resistor applying a first potential to said capacitor, a PNPN diode, a second resistor having a resistance which is much smaller than the resistance of said first resistor, means including said diode and said second resistor connected for applying a second potential to said capacitor, said capacitor and said diode being so arranged that the charge on said capacitor due to said first potential tends to co-operate with said second potential to bias said diode for conduction, a transistor amplifier, means connecting the input of said amplifier to said capacitor, and means connecting an output of said amplifier to said diode for rapidly biasing said diode into conduction in response to the attainment of a predetermined voltage charge level of said capacitor.

References Cited in the file of this patent

UNITED STATES PATENTS

| | | |
|---|---|---|
| 2,452,549 | Cleeton | Nov. 2, 1948 |
| 2,547,523 | Eicher | Apr. 3, 1951 |
| 2,788,449 | Bright | Apr. 9, 1957 |
| 2,841,712 | Hoge et al. | July 1, 1958 |